(12) United States Patent
Takashima et al.

(10) Patent No.: US 10,416,211 B2
(45) Date of Patent: Sep. 17, 2019

(54) APPARATUS FOR ESTIMATING POWER CONSUMPTION, METHOD OF ESTIMATING POWER CONSUMPTION, AND PROGRAM

(71) Applicants: NEC CORPORATION, Tokyo (JP); NEC Platforms, Ltd., Kawasaki-shi, Kanagawa (JP)

(72) Inventors: Daisuke Takashima, Kanagawa (JP); Koji Kudo, Tokyo (JP); Hitoshi Yano, Tokyo (JP); Yasuhisa Tokai, Kanagawa (JP)

(73) Assignees: NEC CORPORATION, Minato-Ku, Tokyo (JP); NEC Platforms, Ltd., Kawasaki-shi, Kanagawa (JP)

( * ) Notice: Subject to any disclaimer, the term of this patent is extended or adjusted under 35 U.S.C. 154(b) by 80 days.

(21) Appl. No.: 15/546,881

(22) PCT Filed: Jan. 19, 2016

(86) PCT No.: PCT/JP2016/051410
§ 371 (c)(1),
(2) Date: Jul. 27, 2017

(87) PCT Pub. No.: WO2016/132796
PCT Pub. Date: Aug. 25, 2016

(65) Prior Publication Data
US 2018/0275176 A1  Sep. 27, 2018

(30) Foreign Application Priority Data
Feb. 19, 2015 (JP) .................... 2015-030220

(51) Int. Cl.
*G06F 11/30* (2006.01)
*G01R 22/06* (2006.01)
(Continued)

(52) U.S. Cl.
CPC .......... *G01R 22/061* (2013.01); *G01R 22/10* (2013.01); *G01W 1/10* (2013.01); *G06F 19/00* (2013.01);
(Continued)

(58) Field of Classification Search
CPC ...................................... G01R 22/061
See application file for complete search history.

(56) References Cited

FOREIGN PATENT DOCUMENTS

JP   07-046761 A   2/1995
JP   11-346438 A   12/1999
(Continued)

OTHER PUBLICATIONS

Nobuyuki Yamaguchi, "Survey of North American evaluation circumstances related to the consumer baseline selection in demand response", Central Research Institute of Electric Power Industry Report, Central Research Institute of Electric Power Industry, Apr. 2013, pp. 1-14, vol. i-iv.

(Continued)

*Primary Examiner* — Phuong Huynh
(74) *Attorney, Agent, or Firm* — Sughrue Mion, PLLC (57) ABSTRACT

An apparatus for estimating power consumption, includes: a receiving section that receives consumer power consumptions of a plurality of days in the past; and a determining section that determines an estimated value of the consumer power consumption by using power consumption on conforming days that conform to a predetermined range from a reference value, among the plurality of days.

16 Claims, 5 Drawing Sheets

(51) Int. Cl.
*G06F 19/00* (2018.01)
*G06Q 50/06* (2012.01)
*G01R 22/10* (2006.01)
*G01W 1/10* (2006.01)
*G06Q 10/04* (2012.01)
*H02J 3/14* (2006.01)
*H02J 3/00* (2006.01)

(52) U.S. Cl.
CPC .............. *G06Q 10/04* (2013.01); *G06Q 50/06* (2013.01); *H02J 3/14* (2013.01); *H02J 2003/007* (2013.01)

(56) References Cited

FOREIGN PATENT DOCUMENTS

| | | |
|---|---|---|
| JP | 2000-270473 A | 9/2000 |
| JP | 2000-276460 A | 10/2000 |
| JP | 2011-024314 A | 2/2011 |
| JP | 2012-196028 A | 10/2012 |
| JP | 2014-075851 A | 4/2014 |
| JP | 2014-124065 A | 7/2014 |
| JP | 2014-131477 A | 7/2014 |
| JP | 2014-168315 * | 9/2014 |
| JP | 2014-168315 A * | 9/2014 |
| JP | 2014-168315 A | 9/2014 |
| WO | 2014/073556 A1 | 5/2014 |

OTHER PUBLICATIONS

International Search Report of PCT/JP2016/051410 dated Apr. 5, 2016 [PCT/ISA/210].
Communication dated Nov. 15, 2016, from Japanese Patent Office in counterpart application No. 2016-538147.

* cited by examiner

APPARATUS FOR ESTIMATING POWER CONSUMPTION, METHOD OF ESTIMATING POWER CONSUMPTION, AND PROGRAM

CROSS REFERENCE TO RELATED APPLICATIONS

This application is a National Stage of International Application No. PCT/JP2016/051410, filed Jan. 19, 2016, claiming priority based on Japanese Patent Application No. 2015-030220, filed Feb. 19, 2015, the contents of all of which are incorporated herein by reference in their entirety.

TECHNICAL FIELD

The present invention relates to an apparatus for estimating power consumption, a method of estimating power consumption, and a program.

BACKGROUND ART

Patent Document 1 discloses, as a technology to adjust power demand in order to balance the power demand, demand response (hereinafter, referred to as "DR") that prompts a consumer to adjust the power demand.

Typically, incentive is provided to the consumer that changes the power demand (the power consumption) according to the DR event (for example, a peak cut event).

It is determined whether the consumer has changed the power demand (the power consumption) according to the DR event, based on a difference between the actual consumer power consumption and a baseline of the consumer, in a DR event time slot. Here, the baseline of the consumer is the estimated value of the consumer power consumption in a case where the DR event is not performed.

Patent Document 1 discloses a method of determining a baseline in which the maximum power consumption in power reduction objective time period (the DR event time slot) of a plurality of days in the past is used as the baseline of the consumer.

Non Patent Document 1 discloses a method of determining a baseline (High X of Y method) in which, out of the power consumptions in the DR event time slot of the past Y days, the average of top X number of power consumptions is estimated as the baseline of the consumer.

RELATED ART DOCUMENTS

Patent Documents

Patent Document 1: WO 2014/073556 A1

Non Patent Documents

Non Patent Document 1: Nobuyuki Yamaguchi, "Survey of North American evaluation circumstances related to the consumer baseline selection in demand response", Central Research Institute of Electric Power Industry Report, Central Research Institute of Electric Power Industry, 2013, April, p. i-iv, 1-14

SUMMARY

Problems to be Solved by the Invention

When there is an unusual day on which power consumption is largely different from the power consumption on other days due to the influence of weather or the like, the setting of the baseline is influenced by the unusual day in the methods for determining the baseline disclosed in Patent Document 1 and Non Patent Document 1. Therefore, it is difficult to set an appropriate baseline.

An object of the present invention is to provide an apparatus for estimating power consumption, a method of estimating power consumption, and a program that make it possible to solve the above-described problem.

Means for Solving the Problems

An apparatus for estimating power consumption according to an exemplary aspect of the present invention includes: a receiving section that receives consumer power consumptions of a plurality of days in the past; and a determining section that determines an estimated value of the consumer power consumption by using power consumption on conforming days that confirm to a predetermined range from a reference value, among the plurality of days.

A method of estimating power consumption according to an exemplary aspect of the present invention includes: receiving consumer power consumptions of a plurality of days in the past; and determining an estimated value of the consumer power consumption by using power consumption on conforming days that confirm to a predetermined range from a reference value, among the plurality of days.

A program according to an exemplary aspect of the present invention causes a computer to execute: a receiving step of receiving consumer power consumptions of a plurality of days in the past; and a determining step of determining an estimated value of the consumer power consumption by using power consumption on conforming days that confirm to a predetermined range from a reference value, among the plurality of days.

Effect of the Invention

The present invention makes it possible to determine that the estimated value of the power consumption is highly reliable.

EXEMPLARY EMBODIMENT

Some exemplary embodiments of the present invention are described below with reference to drawings.

First Exemplary Embodiment

Figure 1:
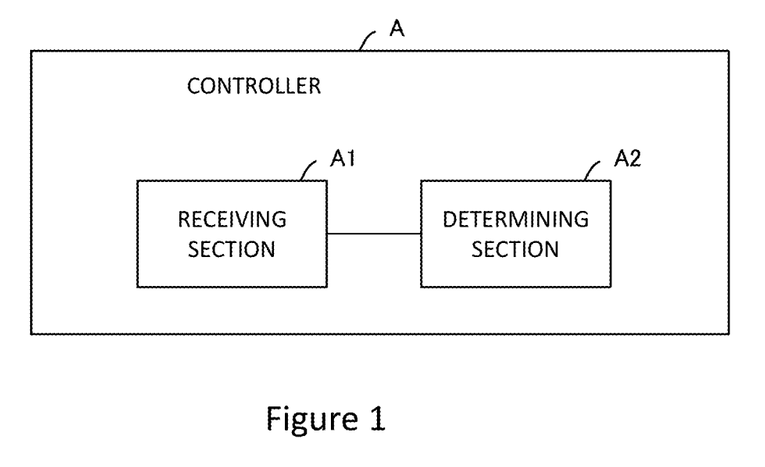
FIG. 1 is a diagram illustrating controller A according to a first exemplary embodiment of the present invention.

FIG. 1 is a diagram illustrating controller A according to a first exemplary embodiment of the present invention.

Controller A determines an estimated value (hereinafter, referred to as a "baseline") of consumer power consumption on the day of a demand response (DR) event (for example, a peak cut event).

The DR event is appropriately changeable without being limited to the peak cut event. The DR event may be, for example, a governor-free (GF) event or a load frequency control (LFC) event.

FIG. 1 is the diagram illustrating controller A according to the first exemplary embodiment of the present invention.

Controller A includes receiving section A1 and determining section A2.

Receiving section A1 receives consumer power consumptions of a plurality of days in the past (hereinafter, simply referred to as the "plurality of days").

The consumer is, for example, each house or each building.

In the present exemplary embodiment, the consumer power consumptions of the past five days are used as the consumer power consumptions of the plurality of days. The consumer power consumptions of the plurality of days are not limited to the consumer power consumptions of the past five days but may be the consumer power consumptions of the past two or more days.

Here, the plurality of days do not include the day of the DR event that prompts the consumer to adjust the power consumption, in order to prevent the result of the DR event from influencing the determination of the baseline because the plurality of days are used to determine the baseline of the DR event day.

In addition, when the DR event is performed on a weekday, the plurality of days are also weekdays, and when the DR event is performed on a holiday, the plurality of days are also holidays, in order to select a day that has a power consumption tendency similar to that of the DR event day because the tendency of the consumer power consumption is typically different between a weekday and a holiday.

Receiving section A1 receives, for example, the consumer power consumptions of the plurality of days from measurement equipment (such as a smart meter) that measures the consumer power consumption. Note that, when there is a management apparatus (for example, an apparatus of an electric power company or an apparatus on the consumer side) that holds the consumer power consumptions of the plurality of days, receiving section A1 may receive the consumer power consumptions of the plurality of days, from the management apparatus. The management apparatus may hold time-dependent power consumption for each piece of measurement equipment (such as the smart meter) or may hold the time-dependent power consumption for each consumer acquired from the electric power company.

In the present exemplary embodiment, receiving section A1 receives the consumer power consumptions of the plurality of days from the management apparatus.

In addition, in the present exemplary embodiment, the consumer power consumptions for the respective time slots are used as the consumer power consumptions of the plurality of days. In the following, the consumer power consumptions for respective hours are used as the consumer power consumptions of the plurality of days. Note that the length of each time slot is appropriately variable without being limited to one hour.

Determining section A2 determines the baseline (the estimated value of the consumer power consumption) by using the power consumptions on conforming days among the plurality of days. Each of the conforming days has the power consumption that conforms to predetermined range from a reference value.

In the present exemplary embodiment, determining section A2 determines the baseline by using the power consumptions each within a specific range $\Delta P$ from the maximum power consumption, from among the consumer power consumptions of the plurality of days.

The maximum power consumption of the consumer power consumptions of the plurality of days is an example of the reference value. The specific range $\Delta P$ is an example of the predetermined range. The consumer power consumptions of the plurality of days are examples of situation values that respectively indicate situations of the plurality of days.

Next, operation in the present exemplary embodiment is described.

Figure 2:
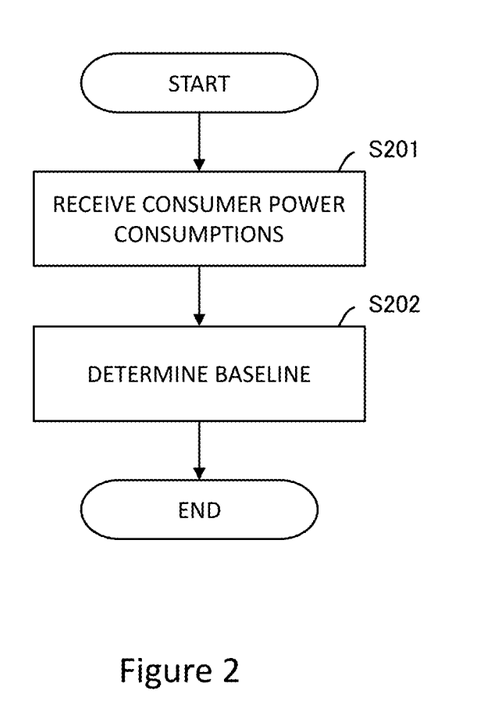
FIG. 2 is a flowchart to explain operation of the first exemplary embodiment.

FIG. 2 is a flowchart to explain the operation in the present exemplary embodiment.

Receiving section A1 receives the consumer power consumptions for respective time slots of each of the plurality of days, from the management apparatus (step S201). For example, receiving section A1 requests the consumer power consumptions for respective time slots of the plurality of days, from the management apparatus, and receives the consumer power consumptions for respective time slots of the plurality of days that are transmitted from the management apparatus in response to the request. Receiving section A1 may receive the consumer power consumptions for respective time slots of the plurality of days that are autonomously transmitted from the management apparatus.

Receiving section A1 executes step S201 at a predetermined time (for example, 5 p.m.) of the day before the DR event. Here, the predetermined time is appropriately changeable without being limited to 5 p.m.

Subsequently, receiving section A1 provides the consumer power consumptions for respective time slots of the plurality of days, to determining section A2.

Determining section A2 receives the consumer power consumptions for respective time slots of the plurality of days.

Thereafter, determining section A2 determines the baseline of the DR event time slot on the DR event day, by using the power consumptions each within the specific range $\Delta P$ from the maximum power consumption, out of the consumer power consumptions of the plurality of days (step S202).

Figure 3:
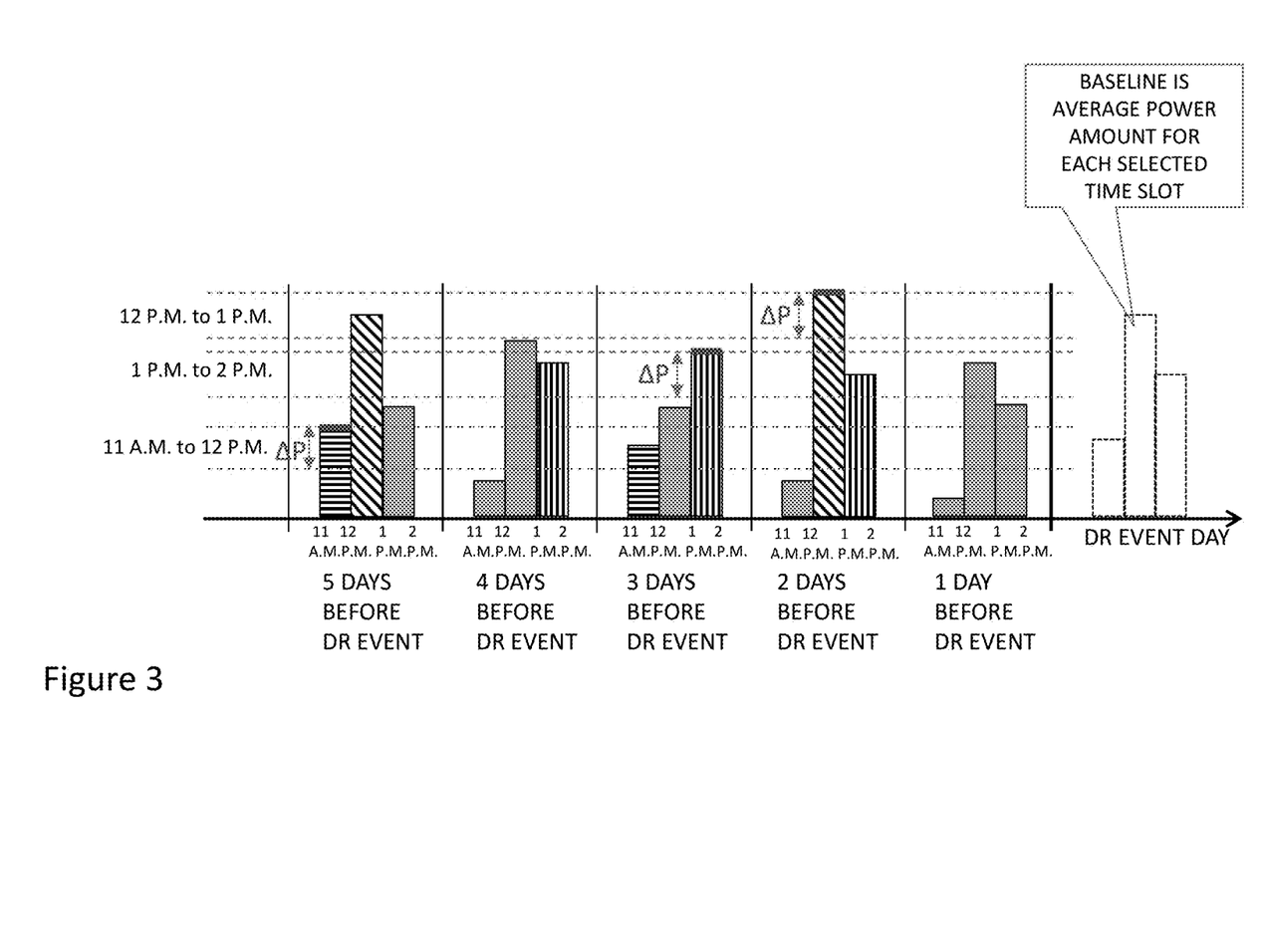
FIG. 3 is a diagram to explain an example of step S202.

FIG. 3 is a diagram to explain an example of step S202.

In FIG. 3, five days from five days before the DR event to one day before the DR event is used as the plurality of days. It is assumed that the DR event is not performed during the five days. In addition, the DR event time slot is a time slot from 11 a.m. to 2 p.m.

In FIG. 3, the power consumption per hour in the time slot (11 a.m. to 2 p.m.) of the DR event on each day from five days before the DR event to one day before the DR event is illustrated.

Determining section A2 determines the maximum power consumption per hour in the DR event time slot, from the power consumptions of five days from five days before the DR event to one day before the DR event.

In the example illustrated in FIG. 3, as for one hour from 11 a.m. to 12 p.m. in the DR event time slot, determining section A2 determines the power consumption of one hour from 11 a.m. to 12 p.m. of five days before the DR event, as the maximum power consumption of the time slot (11 a.m. to 12 p.m.).

In addition, as for one hour from 12 p.m. to 1 p.m. in the DR event time slot, determining section A2 determines the power consumption of one hour from 12 p.m. to 1 p.m. of two days before the DR event, as the maximum power consumption of the time slot (12 p.m. to 1 p.m.).

Further, as for one hour from 1 p.m. to 2 p.m. in the DR event time slot, determining section A2 determines the power consumption of one hour from 1 p.m. to 2 p.m. of three days before the DR event, as the maximum power consumption of the time slot (1 p.m. to 2 p.m.).

Subsequently, determining section A2 determines, as the baseline of each hour, the average of the power consumptions each within the specific range ΔP (for example, 600 kWh) from the maximum power consumption for each hour in the DR event time slot.

In the example illustrated in FIG. 3, as for one hour from 11 a.m. to 12 p.m. in the DR event time slot, determining section A2 determines, as the baseline of the hour from 11 a.m. to 12 p.m. in the DR event time slot, the average of the power consumption of the hour from 11 a.m. to 12 p.m. of five days before the DR event and the power consumption of the hour from 11 a.m. to 12 p.m. of three days before the DR event. Note that the conforming days for the hour from 11 a.m. to 12 p.m. in the DR event time slot are the five days before the DR event and the three days before the DR event.

In addition, as for one hour from 12 p.m. to 1 p.m. in the DR event time slot, determining section A2 determines, as the baseline of the hour from 12 p.m. to 1 p.m. in the DR event time slot, the average of the power consumption of the hour from 12 p.m. to 1 p.m. of two days before the DR event and the power consumption of the hour from 12 p.m. to 1 p.m. of five days before the DR event. Note that the conforming days for the hour from 12 p.m. to 1 p.m. in the DR event time slot are the two days before the DR event and the five days before the DR event.

In addition, as for one hour from 1 p.m. to 2 p.m. in the DR event time slot, determining section A2 determines, as the baseline of the hour from 1 p.m. to 2 p.m. in the DR event time slot, the average of the power consumption of the hour from 1 p.m. to 2 p.m. of three days before the DR event, the power consumption of the hour from 1 p.m. to 2 p.m. of four days before the DR event, and the power consumption of the hour from 1 p.m. to 2 p.m. of two days before the DR event. Note that the conforming days for the hour from 1 p.m. to 2 p.m. in the DR event time slot are the three days before the DR event and the four days before the DR event.

Subsequently, determining section A2 outputs the baseline of the DR event time slot on the DR event day.

For example, when controller A is placed on the electric power company side, on aggregator side, or on power producer and supplier (PPS) side, determining section A2 provides the consumer with the baseline of the DR event time slot on the DR event day.

Further, when controller A is placed on the consumer side, determining section A2 provides the electric power company, the aggregator, or the PPS, with the baseline of the DR event time slot on the DR event day.

Receiving section A1 and determining section A2 execute the above-described operation for each consumer.

Next, effects of the present exemplary embodiment are described.

According to the present exemplary embodiment, receiving section A1 receives the consumer power consumptions of the plurality of days. Determining section A2 determines the baseline by using the power consumptions each within the specific range ΔP from the maximum power consumption, out of the consumer power consumptions of the plurality of days.

This makes it possible to determine the baseline by using the power consumptions on days that are similar in situation (the power consumption) to each other. Moreover, this makes it possible to determine the baseline without using the power consumption on a day that is not similar in situation. Accordingly, it is possible to determine the baseline with high reliability.

Moreover, in the method of determining the baseline according to the present exemplary embodiment, the baseline is determined with essential use of the maximum power consumption. Therefore, there is a high possibility that the baseline determined through the method of determining the baseline according to the present exemplary embodiment may correspond to the power consumption at the peak. In a system that implements the DR event at the power peak, it is necessary to determine the baseline at the peak. Accordingly, the present exemplary embodiment is compatible with the system that implements the DR event at the power peak.

The power consumptions of the plurality of days are the power consumptions for respective time slots. Determining section A2 determines the baseline for each time slot by using the power consumptions for the time slot of the conforming days.

This makes it possible to determine the baseline for each time slot with high reliability.

Determining section A2 determines, as the baseline, the average of the power consumptions for the time slot of the conforming days. This makes it possible to easily determine the baseline by using the power consumptions for the time slot of the conforming days.

The plurality of days are days on which the DR event to prompt the consumer to adjust the power consumption is not performed.

Therefore, it is possible to determine the baseline without influencing the DR event. This makes it possible to determine the baseline with high reliability.

In the present exemplary embodiment, the consumer power consumptions of the plurality of days are also used as situation values respectively indicating the situations of the plurality of days.

This makes it possible to reduce the amount of information that is received by the receiving section, as compared with a second exemplary embodiment described later. In addition, since the consumer power consumptions of the plurality of days also function as the situation values, it is possible to effectively use the consumer power consumptions of the plurality of days.

Next, a modification of the present exemplary embodiment is described.

Determining section A2 may vary the specific range ΔP depending on the time slot.

In addition, when the number of power consumptions that are each within the specific range ΔP from the maximum power consumption (the number of conforming days) is smaller than a first threshold (the first threshold is an integer of 1 or more), determining section A2 may enlarge the specific range ΔP. For example, determining section A2 may vary the specific range ΔP such that the number of power consumptions each within the specific range ΔP from the maximum power consumption (the number of conforming days) becomes equal to or larger than the first threshold. Further, the first threshold may be appropriately varied at optional timing.

Second Exemplary Embodiment

In the first exemplary embodiment, the consumer power consumptions of the plurality of days are used as the situation values respectively indicating the situations of the plurality of days. In contrast, in the second exemplary embodiment, temperatures of the plurality of days are used as the situation values respectively indicating the situations of the plurality of days.

Figure 4:
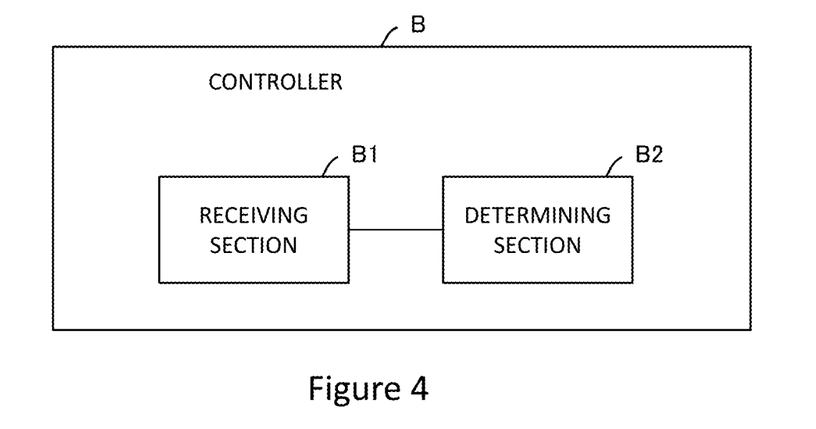
FIG. 4 is a diagram illustrating controller B according to a second exemplary embodiment of the present invention.

FIG. 4 is a diagram illustrating controller B according to the second exemplary embodiment of the present invention.

Controller B includes receiving section B1 and determining section B2.

Receiving section B1 receives the consumer power consumptions of the plurality of days and temperatures of the plurality of days. Note that it is commonly known that the temperature correlates with the consumer power consumption. The temperature is an example of information correlated with the power consumption.

The consumer power consumptions of the plurality of days that are received by receiving section B1 are similar to the consumer power consumptions of the plurality of days that are received by receiving section A1. Therefore, also in the present exemplary embodiment, the consumer power consumption for respective time slots (for respective hours) are used as the consumer power consumptions of the plurality of days.

A method in which receiving section B1 receives the consumer power consumptions of the plurality of days is similar to the method in which receiving section A1 receives the consumer power consumptions of the plurality of days.

Receiving section B1 receives the temperatures of the plurality of days from an apparatus that holds the temperatures of the plurality of days. For example, when the apparatus that holds the consumer power consumptions of the plurality of days also holds the temperatures of the plurality of days, receiving section B1 receives the temperatures of the plurality of days from the apparatus.

The temperature is an example of the situation value indicating the situation of each of the plurality of days. The situation value is appropriately changeable without being limited to the temperature.

Determining section B2 determines the baseline by using the power consumptions of days (the conforming days) that each have the temperature within a predetermined range from a reference value, among the plurality of days.

The reference value is, for example, a predicted temperature on an objective day of the baseline (on a day on which the power consumption is estimated; the DR event day in the present exemplary embodiment). In the present exemplary embodiment, the predicted highest temperature on the objective day of the baseline is used as the reference value.

Next, operation according to the present exemplary embodiment is described.

Figure 5:
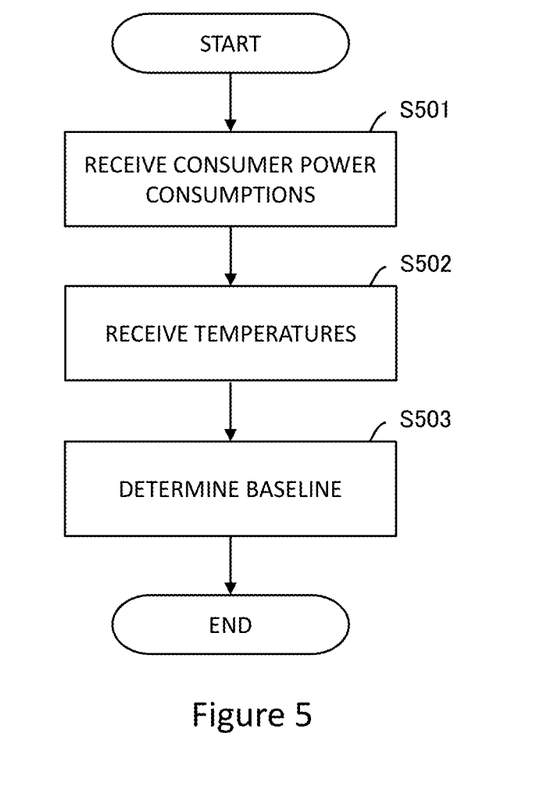
FIG. 5 is a flowchart to explain operation of the second exemplary embodiment.

FIG. 5 is a flowchart to explain the operation according to the present exemplary embodiment.

Receiving section B1 receives the consumer power consumption for respective time slots of each of the plurality of days from the management apparatus (step S501). Receiving section B1 executes step S501 at a predetermined time (for example, 5 p.m.) of the day before the DR event. The predetermined time is not limited to 5 p.m. but is changeable when appropriate.

Subsequently, receiving section B1 receives the respective temperatures of the plurality of days from the apparatus that holds the respective temperatures of the plurality of days (step S502). For example, receiving section B1 requests the respective temperatures of the plurality of days from the apparatus that holds the respective temperatures of the plurality of days, and receives the respective temperatures of the plurality of days that are transmitted from the apparatus in response to the request. Receiving section B1 may receive the respective temperatures of the plurality of days autonomously transmitted from the apparatus that holds the respective temperatures of the plurality of days.

Subsequently, receiving section B1 provides determining section B2 with the consumer power consumptions for respective time slots of the plurality of days and the temperatures of the plurality of days.

Determining section B2 receives the consumer power consumptions for respective time slots of the plurality of days and the temperatures of the plurality of days.

Subsequently, determining section B2 receives the predicted highest temperature of the next day. For example, determining section B2 receives the predicted highest temperature of the next day from a temperature prediction site that predicts the temperature of the next day. For example, determining section B2 requests the predicted highest temperature of the next day from the temperature prediction site, and receives the predicted highest temperature of the next day that is transmitted from the temperature prediction site in response to the request. Determining section B2 may receive the predicted highest temperature of the next day that is autonomously transmitted from the temperature prediction site. Further, determining section B2 may acquire the predicted highest temperature of the next day through receiving section B1.

Subsequently, determining section B2 specifies, as the conforming day, a day that has the highest temperature whose difference from the predicted highest temperature of the next day is within a predetermined range $\Delta T$, among the plurality of days.

Subsequently, determining section A2 determines the baseline of the DR event time slot on the DR event day by using the power consumption of the conforming day (step S503).

Figures 6, 7:
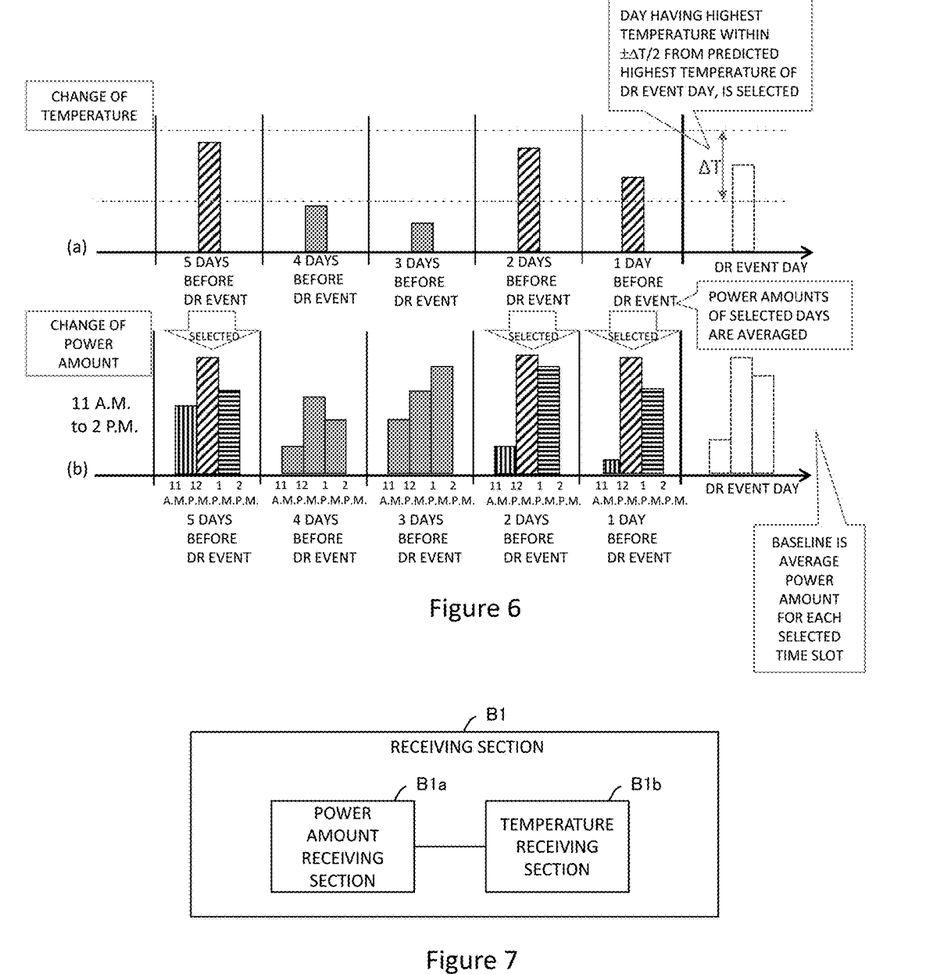
FIG. 6 is a diagram to explain an example of step S503.
FIG. 7 is a diagram illustrating an example of receiving section B1.

FIG. 6 is a diagram to explain an example of step S503.

In FIG. 6, five days from five days before the DR event to one day before the DR event are used as the plurality of days. It is assumed that the DR event is not performed during the five days. In addition, it is assumed that the DR event time slot is the time slot from 11 a.m. to 2 p.m.

Portion (a) in FIG. 6 is a diagram illustrating relationship of the highest temperature of each day from five days before the DR event to one day before the DR event, the predicted highest temperature of the DR event day, and the predetermined range $\Delta T$.

Portion (b) of FIG. 6 is a diagram illustrating the power consumptions for respective hours in the DR event time slot (11 a.m. to 2 p.m.) of each day from five days before the DR event to one day before the DR event.

Determining section B2 selects, as the conforming day, the day that has the highest temperature whose difference from the predicted highest temperature of the DR event day is within the predetermined range $\Delta T$ (for example, $\Delta T$ is $\pm 1.5$ degrees), among the five days from five days before the DR event to one day before the DR event. The predetermined range $\Delta T$ is appropriately variable without being limited to $\pm 1.5$ degrees.

In the example illustrated in portion (a) of FIG. 6, three days, namely, five days before the DR event, two days before the DR event, and one day before the DR event are selected as the conforming days.

Subsequently, determining section B2 determines the average of the power consumptions, for each hour, of the conforming days as the baseline for each hour in the DR event time slot.

In the example illustrated in portion (b) in FIG. 6, determining section B2 determines the average power consumption of the hour from 11 a.m. to 12 p.m. between five days before the DR event, two days before the DR event, and one day before the DR event, as the baseline of the hour from 11 a.m. to 12 p.m. in the DR event time slot on the DR event day.

In addition, determining section B2 determines the average power consumption of the hour from 12 p.m. to 1 p.m. between five days before the DR event, two days before the DR event, and one day before the DR event, as the baseline of the hour from 12 p.m. to 1 p.m. in the DR event time slot on the DR event day.

Moreover, determining section B2 determines the average power consumption of the hour from 1 p.m. to 2 p.m. between five days before the DR event, two days before the DR event, and one day before the DR event, as the baseline of the hour from 1 p.m. to 2 p.m. in the DR event time slot on the DR event day.

Subsequently, determining section B2 outputs the baseline of the DR event time slot on the DR event day.

For example, when controller B is placed on the electric power company side, on the aggregator side, or on the PPS side, determining section B2 provides the consumer with the baseline of the DR event time slot on the DR event day.

Further, when controller B is placed on the consumer side, determining section B2 provides the electric power company, the aggregator, or the PPS with the baseline of the DR event time slot on the DR event day.

Receiving section B1 and determining section B2 execute the above-described operation for each consumer.

Next, effects of the present exemplary embodiment are described.

In the present exemplary embodiment, receiving section B1 receives the consumer power consumptions of the plurality of days and the temperatures of the plurality of days. Determining section B2 determines the baseline by using the power consumptions of the conforming days among the plurality of days. Each of the conforming days has the highest temperature whose difference from the predicted highest temperature of the DR event day is within the predetermined range $\Delta T$.

This makes it possible to determine the baseline by using the power consumptions of the conforming days that are similar in situation to the DR event day. Moreover, this makes it possible to determine the baseline without using the power consumption of a day that is not similar in situation to the DR event day. Accordingly, it is possible to determine the baseline with high reliability.

Moreover, the technologies disclosed in Patent Document 1 and Non Patent Document 1 are only to reduce the power consumption at the peak such as tight power condition. Therefore, the method of determining the baseline disclosed in Patent Document 1 and the method of determining the baseline disclosed in Non Patent Document 1 determine the baseline essentially by using the maximum power consumption.

In contrast, in the method of determining the baseline according to the present exemplary embodiment, the baseline is determined without preferentially using the maximum power consumption. Therefore, the present exemplary embodiment makes it possible to cope with various DR events under a situation largely introducing regeneration energy such as photovoltaic (PV) that has large output variation, without being limited to the case where the power consumption at the peak such as tight power condition is reduced. Accordingly, the method of determining the baseline according to the present exemplary embodiment is high in versatility.

Next, a modification of the present exemplary embodiment is described.

As the reference value, the predicted lowest temperature or the predicted average temperature on the DR event day may be used in place of the predicted highest temperature of the DR event day.

When the predicted lowest temperature on the DR event day is used in place of the predicted highest temperature of the DR event day, determining section B2 determines the baseline by using the power consumption of a day (a conforming day) that has the lowest temperature whose difference from the predicted lowest temperature of the DR event day is within the predetermined range $\Delta T$, among the plurality of days.

When the predicted average temperature on the DR event day is used in place of the predicted highest temperature of the DR event day, determining section B2 determines the baseline by using the power consumption of a day (a conforming day) that has the average temperature whose difference from the predicted average temperature on the DR event day is within the predetermined range $\Delta T$, among the plurality of days.

Note that the reference value is not limited to the predicted temperature but is changeable when appropriate. It is sufficient to use, as the reference value, information correlated with the power consumption.

In addition, receiving section B1 may receive the information relating to environment such as the temperature (the predicted highest temperature, the predicted lowest temperature, or the predicted average temperature) from an apparatus on the consumer side, or database DB (for example, DB on the temperature prediction site) in which meteorological data is accumulated.

As illustrated in FIG. 7, receiving section B1 may include a power amount receiving section B1$a$ and a temperature receiving section B1$b$. The power amount receiving section B1$a$ receives the consumer power consumptions of the plurality of days. The temperature receiving section B1$b$ receives the temperatures of the plurality of days. The power amount receiving section B1$a$ is an example of a first receiving section. The temperature receiving section B1$b$ is an example of a second receiving section.

When the number of conforming days is smaller than a second threshold (the second threshold is an integer of 1 or more), determining section B2 may enlarge the predetermined range $\Delta T$. For example, determining section B2 may vary the predetermined range $\Delta T$ such that the number of the conforming days is equal to or larger than the second threshold. Moreover, the second threshold may be appropriately varied at optional timing.

Third Exemplary Embodiment

A third exemplary embodiment of the present invention is a combination of the first exemplary embodiment and the second exemplary embodiment.

In the second exemplary embodiment, for example, when the predicted highest temperature of the DR event day is higher than the temperature that is obtained by adding the predetermined range $\Delta T$ to the highest temperature among temperatures of five days before the DR event to one day before the DR event, no conforming day is present. As a supplement to the second exemplary embodiment, when no conforming day is present, determining section B2 outputs, for example, an error.

Therefore, in the third exemplary embodiment, the method described in the second exemplary embodiment is first performed. At this time, when no conforming day is present, the method described in the second exemplary embodiment is stopped, and the method described in the first exemplary embodiment is performed.

Figure 8:
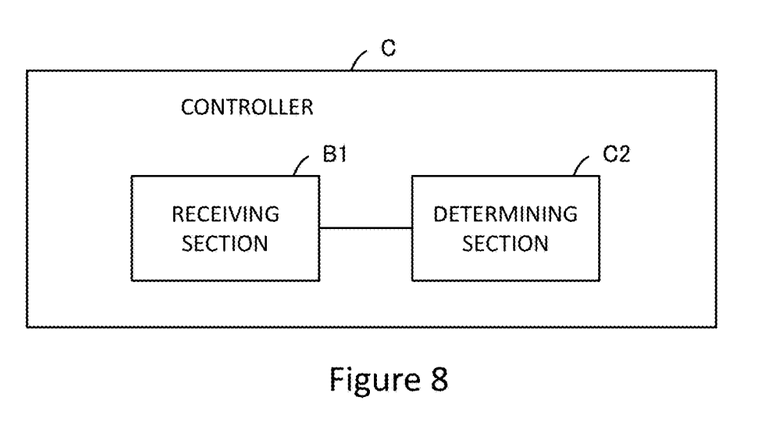
FIG. 8 is a diagram illustrating a controller C according to a third exemplary embodiment.

FIG. 8 is a diagram illustrating controller C according to the third exemplary embodiment. In FIG. 8, a component that has the same configuration as that illustrated in FIG. 4 is denoted by the same reference numeral. In the following, the third exemplary embodiment is described mainly to differentiate it from the configuration illustrated in FIG. 4.

Controller C includes receiving section B1 and determining section C2.

Determining section C2 executes the function of determining section B2 described in the second exemplary embodiment. When no conforming day is present, determining section C2 executes the function of determining section A2 described in the first exemplary embodiment.

Next, operation in the present exemplary embodiment is described.

Figure 9:
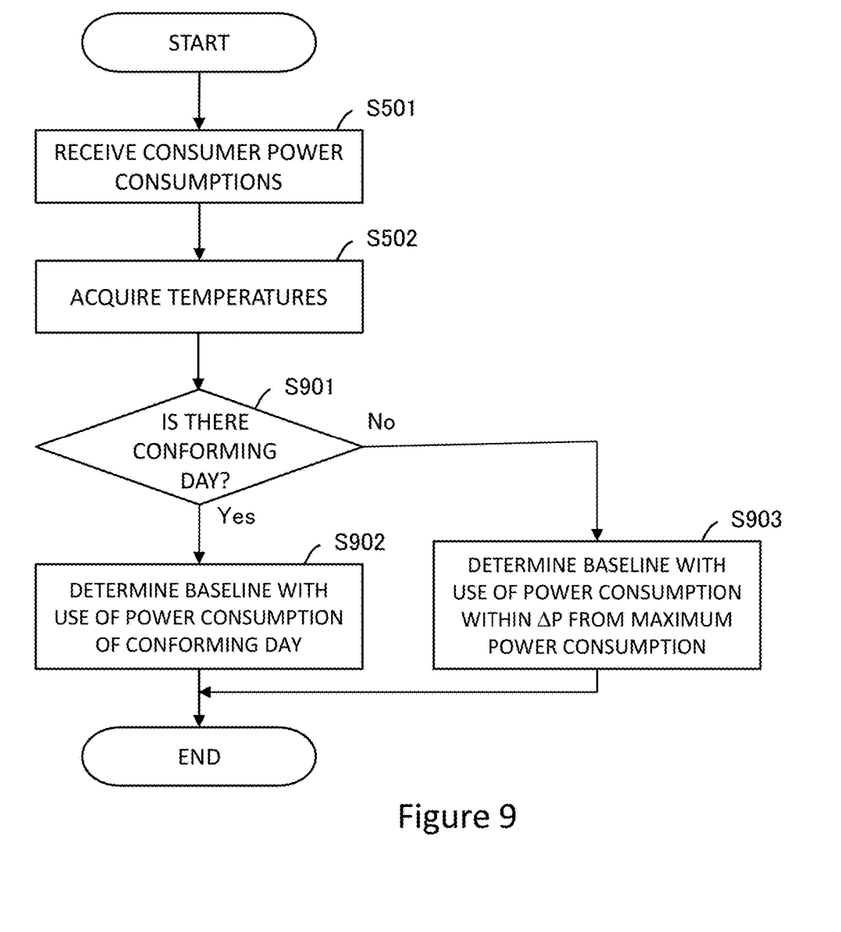
FIG. 9 is a flowchart to explain operation of the third exemplary embodiment.

FIG. 9 is a flowchart to explain the operation in the present exemplary embodiment. In FIG. 9, a process similar to the process illustrated in FIG. 5 is denoted by the same reference numeral.

Receiving section B1 receives the consumer power consumptions for respective time slots of each of the plurality of days, from the management apparatus (step S501). Receiving section B1 executes step S501 at a predetermined time (for example, 5 p.m.) of the day before the DR event. The predetermined time is not limited to 5 p.m. but is changeable when appropriate.

Subsequently, receiving section B1 receives the respective temperatures of the plurality of days from an apparatus that holds the respective temperatures of the plurality of days (step S502).

Thereafter, receiving section B1 provides the consumer power consumptions for respective time slots of the plurality of days and the temperatures of the plurality of days, to determining section C2.

Determining section C2 receives the consumer power consumptions for respective time slots of the plurality of days and the temperatures of the plurality of days.

Subsequently, determining section C2 receives the predicted highest temperature of the next day. For example, determining section A2 receives the predicted highest temperature of the next day from a temperature prediction site that predicts the temperature of the next day.

Thereafter, determining section C2 determines whether the plurality of days include a conforming day that has the highest temperature whose difference from the predicted highest temperature of the next day is within the predetermined range $\Delta T$ (step S901).

When the conforming day is present, determining section C2 determines the baseline of the DR event time slot of the DR event day, by using the power consumption of the conforming day (step S902).

The process in step S902 is similar to the process in step S503 illustrated in FIG. 5.

In contrast, when no conforming day is present, determining section C2 determines the baseline of the DR event time slot of the DR event day, by using the power consumptions each within the specific range $\Delta P$ from the maximum power consumption, from among the consumer power consumptions of the plurality of days (step S903).

The process in step S903 is similar to the process in step S202 illustrated in FIG. 2. Subsequent to step S902 or S903, determining section C2 outputs the baseline of the DR event time slot of the DR event day.

For example, when controller C is placed on the electric power company side, on the aggregator side, or on the PPS side, determining section C2 provides the consumer with the baseline of the DR event time slot on the DR event day.

Further, when controller C is placed on the consumer side, determining section C2 provides the electric power company, the aggregator, or the PPS with the baseline of the DR event time slot on the DR event day.

Receiving section B1 and determining section C2 execute the above-described operation for each consumer.

Next, effects of the present exemplary embodiment are described.

The present exemplary embodiment makes it possible to determine the baseline with high reliability even if no conforming day is present.

Next, a modification of the present exemplary embodiment is described.

The modification of the first exemplary embodiment may be applied to the part of the present exemplary embodiment corresponding to the first exemplary embodiment. Further, the modification of the second exemplary embodiment may be applied to the part of the present exemplary embodiment corresponding to the second exemplary embodiment.

Next, a modification common to the exemplary embodiments is described.

Each of the determining sections may determine the baseline through the above-described method for the time slot other than the DR event time slot on the DR event day.

In addition, each of the determining sections may determine the baseline on a day that is different from the DR event day, instead of determining the baseline on the DR event day (the objective day of the baseline). In this case, the day that is different from the DR event day becomes the objective day of the baseline.

Further, each of the determining sections may change the baseline that has been determined once, depending on the performance value of the power consumption of a time slot before the DR event time slot on the DR event day.

For example, when the DR event time slot on the DR event day is 11 a.m. to 2 p.m. and the performance value of the power consumption in the time slot from 9 a.m. to 10 a.m. on the DR event day is smaller than the baseline, each of the determining sections lowers the baseline of the DR event time slot.

In addition, each of the determining sections may receive the performance value of the consumer power consumption on the DR event day, and output information corresponding to the difference between the baseline and the performance value (for example, incentive information varied accordingly to the difference). The information is provided to, for example, an apparatus on the consumer side.

Moreover, each of the determining sections may receive the performance value of the consumer power consumption of the DR event time slot on the DR event day, and output information corresponding to the difference between the baseline of the time slot and the performance value (for example, incentive information varied accordingly to the difference). Also in this case, the information is provided to, for example, the apparatus on the consumer side.

In the above-described respective exemplary embodiments, controllers A, B, and C each may be realized by a computer. In this case, the computer loads and executes a program that is recorded in a computer-readable recording medium, and executes the function of any one of controllers A, B and C. The recording medium is, for example, a compact disk read only memory (CD-ROM). The recording medium is not limited to the CD-ROM but is changeable when appropriate.

In the respective exemplary embodiments described above, the illustrated configurations are merely examples, and the present invention is not limited to the configurations.

In addition, although the invention of the present application has been described with reference to the exemplary embodiments, the invention of the present application is not limited to the above-described exemplary embodiments. Various modifications appreciated by those skilled in the art may be made on the configuration and the detail of the invention of the application, within the scope of the invention of the present application.

EXPLANATION OF THE REFERENCE NUMBERS

| | |
|---|---|
| A, B, C | Controller |
| A1, B1 | Receiving section |
| A2, B2, C2 | Determining section |
| B1a | Power consumption receiving section |
| B1b | Temperature receiving section |

The invention claimed is:

1. An apparatus for estimating power consumption, the apparatus comprising:
a memory storing instructions; and
at least one processor configured to process the instructions to implement:
a receiving section configured to receive consumer power consumptions of a plurality of days in the past; and
a determining section configured to determine an estimated value of the consumer power consumption by using power consumption on conforming days that conform to a predetermined range from a reference value, among the plurality of days,
wherein:
the power consumptions of the plurality of days are power consumptions for respective time slots;
the reference value is the maximum power consumption of the power consumptions for the respective time slots of the plurality of days; and
said determining section is further configured to determine the estimated value of the power consumption for each of the time slots by using the power consumptions for the respective time slots of the conforming day.

2. The apparatus for estimating power consumption according to claim 1, wherein said determining section is further configured to determine, as the estimated value of the power consumption for each of the time slots, the average of the power consumptions for the time slot of the conforming days.

3. The apparatus for estimating power consumption according to claim 1, wherein said determining section is further configured to use, as the conforming day, a day on which the power consumption for each of the time slots is within a predetermined range from the reference value, among the plurality of days.

4. The apparatus for estimating power consumption according to claim 3, wherein said determining section is further configured to determine, as the estimated value of the power consumption, the average of the power consumptions of the conforming days, set for each of the time slots.

5. The apparatus for estimating power consumption according to claim 1, wherein said determining section is further configured to vary the predetermined range depending on time slot.

6. The apparatus for estimating power consumption according to claim 1, wherein said determining section is further configured to output the estimated value of the power consumption for each of the consumers.

7. The apparatus for estimating power consumption according to claim 1, wherein said determining section is further configured to change the estimated value of the power consumption based on a difference between the estimated value of the power consumption and performance of the consumer power consumptions on an objective day of the power consumption estimation.

8. The apparatus for estimating power consumption according to claim 1, wherein the plurality of days are days on which demand response to prompt the consumers to adjust power consumption is not performed.

9. The apparatus for estimating power consumption according to claim 1, wherein when the objective day of the power consumption estimation is a weekday, the plurality of days are weekdays.

10. The apparatus for estimating power consumption according to claim 1, wherein when the objective day of the power consumption estimation is a holiday, the plurality of days are holidays.

11. The apparatus for estimating power consumption according to claim 1, wherein said determining section is further configured to determine the predetermined range from the reference value to cause the number of the conforming days to be equal to or larger than a predetermined threshold.

12. An apparatus for estimating power consumption, the apparatus comprising:
a memory storing instructions; and
at least one processor configured to process the instructions to implement:
a receiving section configured to receive consumer power consumptions of a plurality of days in the past; and
a determining section configured to determine an estimated value of the consumer power consumption by using power consumption on conforming days that conform to a predetermined range from a reference value, among the plurality of days,
wherein:
said determining section is further configured to use, as the conforming day, a day on which information correlated with the power consumption is within a predetermined range, among the plurality of days;
said determining section is further configured to determine, as the estimated value of the power consumption, the average of the power consumptions of the conforming days, set for each of the time slots; and
said determining section is further configured to the estimated value of the power consumption by using the power consumption within a specific range from the maximum power consumption out of the power consumptions of the plurality of days when no conforming day is present.

13. A method of estimating power consumption, the method comprising:
   receiving consumer power consumptions of a plurality of days in the past; and
   determining an estimated value of the consumer power consumption by using power consumption on conforming days that conform to a predetermined range from a reference value, among the plurality of days,
   wherein:
      the power consumptions of the plurality of days are power consumptions for respective time slots;
      the reference value is the maximum power consumption of the power consumptions for the respective time slots of the plurality of days; and
      said determining section determines the estimated value of the power consumption for each of the time slots by using the power consumptions for the respective time slots of the conforming day.

14. A method of estimating power consumption, the method comprising:
   receiving consumer power consumptions of a plurality of days in the past; and
   determining an estimated value of the consumer power consumption by using power consumption on conforming days that conform to a predetermined range from a reference value, among the plurality of days,
   wherein:
      said determining section uses, as the conforming day, a day on which information correlated with the power consumption is within a predetermined range, among the plurality of days;
      said determining section determines, as the estimated value of the power consumption, the average of the power consumptions of the conforming days, set for each of the time slots; and
      said determining section determines the estimated value of the power consumption by using the power consumption within a specific range from the maximum power consumption out of the power consumptions of the plurality of days when no conforming day is present.

15. A non-transitory computer-readable recording media for storing executable computer program instructions which when executed by a computer cause the computer to execute:
   a receiving step of receiving consumer power consumptions of a plurality of days in the past; and
   a determining step of determining an estimated value of the consumer power consumption by using power consumption on conforming days that conform to a predetermined range from a reference value, among the plurality of days,
   wherein:
      the power consumptions of the plurality of days are power consumptions for respective time slots;
      the reference value is the maximum power consumption of the power consumptions for the respective time slots of the plurality of days; and
      said determining section determines the estimated value of the power consumption for each of the time slots by using the power consumptions for the respective time slots of the conforming day.

16. A non-transitory computer-readable recording media for storing executable computer program instructions which when executed by a computer cause the computer to execute:
   a receiving step of receiving consumer power consumptions of a plurality of days in the past; and
   a determining step of determining an estimated value of the consumer power consumption by using power consumption on conforming days that conform to a predetermined range from a reference value, among the plurality of days,
   wherein:
      said determining section uses, as the conforming day, a day on which information correlated with the power consumption is within a predetermined range, among the plurality of days;
      said determining section determines, as the estimated value of the power consumption, the average of the power consumptions of the conforming days, set for each of the time slots; and
      said determining section determines the estimated value of the power consumption by using the power consumption within a specific range from the maximum power consumption out of the power consumptions of the plurality of days when no conforming day is present.

* * * * *